United States Patent [19]

Suzuki et al.

[11] Patent Number: 5,023,839
[45] Date of Patent: Jun. 11, 1991

[54] REDUNDANT SEMICONDUCTOR MEMORY DEVICE

[75] Inventors: Noriaki Suzuki; Junichi Miyamoto; Nobuaki Ohtsuka, all of Yokohama, Japan

[73] Assignee: Kabushiki Kaisha Toshiba, Kawasaki, Japan

[21] Appl. No.: 551,330

[22] Filed: Jul. 12, 1990

[30] Foreign Application Priority Data

Jul. 13, 1989 [JP] Japan .................................. 1-181409

[51] Int. Cl.$^5$ .............................................. G11C 29/00
[52] U.S. Cl. ..................................... 365/200; 365/185; 365/210
[58] Field of Search ....................... 365/200, 185, 210

[56] References Cited

U.S. PATENT DOCUMENTS 4,817,052  3/1989  Shinoda et al. .................... 365/210
4,885,720  12/1989  Miller et al. ....................... 365/200

Primary Examiner—James W. Moffitt
Attorney, Agent, or Firm—Foley & Lardner

[57] ABSTRACT

An improved semiconductor memory device having a memory array, a dummy cell and a redundancy cell column is disclosed. At least one dummy capacity cell is connected to the reference bit line to which the dummy cell is connected, and also to a redundancy bit line to which redundancy cells are connected. Therefore, since a capacity on the reference bit line is roughly equalized to that on the redundancy bit line by these dummy capacity cells, it is possible to prevent erroneous potential level determination by a sense amplifier for comparing both the potentials on both the bit lines, without being subjected to the influence of supply voltage fluctuations.

2 Claims, 2 Drawing Sheets

REDUNDANT SEMICONDUCTOR MEMORY DEVICE

BACKGROUND OF THE INVENTION

The present invention relates to a semiconductor memory device, and more particularly to a non-volatile semiconductor memory device provided with a differential sense amplifier.

In non-volatile semiconductor memory devices provided with a differential sense amplifier, for instance such as ultraviolet light erasable programmable read-only-memories (EPROM), a potential read according to a memory data stored in a memory cell selected by an address is compared with a reference potential read from a reference (dummy) cell by the sense amplifier, to determine whether the stored data level is "1" or "0".

In the EPROM as described above, the total capacity of a plurality of dummy capacity cells DC each of whose drain terminals is connected to a reference (dummy) bit line DBL is so determined that the capacity produced at each bit line BL is roughly equal to that produced at the dummy bit line DBL.

Recently, on the other hand, redundancy techniques whereby a memory device including some defective memory cells is usable as a non-defective memory device have been widely adopted with remarkably increasing memory capacity. In the EPROM, therefore, it has become important more and more to alleviate not only the row defectiveness but also the column defectiveness, in particular. In this case, in addition to memory cells arranged in m (rows) x n (columns) matrix form, a plurality of redundancy cell columns are provided by arranging the same memory cells in m-column form. In case one of the memory cells MC arranged in m (rows) x n (columns) matrix form is defective and further a column address for selecting a cell column including a defective memory cell is inputted, one of the redundancy cell columns is selected, instead of the cell column including the defective cell memory, for relief of the defective memory cell.

The EPROM is usually provided with a current drive capability in the output buffer circuit, in order to generate an output compatible with that of a transistor-transistor logic circuit TTL. Therefore, when data are outputted, potential fluctuations (noise) occur on an inner voltage supply line within a chip. To suppress the above noise, a method has so far been proposed whereby the voltage supply line for the output buffer circuits is separated from that for the other inner circuits. In this method of separating the two voltage supply lines, however, it is impossible to perfectly suppress the occurrence of the above-mentioned noise. Once noise is generated on the voltage supply line, since each potential at each node of the inner circuit to which voltage is supplied via the voltage supply line fluctuates, potentials of the bit lines BL, the reference bit lines DBL, the sense line SL, and the reference potential line RL all change according to supply voltage fluctuations.

In the prior-art EPROM, a plurality of dummy capacity cells DC are connected to the reference bit line DBL so that the capacity produced at each bit line for selecting a memory cell MC arranged in m (rows) x n (columns) matrix form is equal to that produced at the reference bit line DBL. Therefore, in case the supply voltage Vcc fluctuates, since the potential $V_R$ on the reference potential line RL connected to the reference cells fluctuates in synchronism with that $V_S$ at the sense line SL generated whenever data are read out of the memory cells MC, there exists no problem in that the data read out of the memory cells MC are erroneously determined to be "1" or "0".

In general, however, since the capacity produced on the redundancy bit line to which drains of cells of the redundancy cell column is not determined equal to that produced on the reference bit line DBL, when a redundancy cell column is selected when the supply voltage is fluctuating, the potential $V_R$ on the reference potential line RL does not necessarily fluctuate in synchronism with that $V_S$ on the sense line SL, thus resulting in a problem in that the read data potential level is erroneously determined to be "1" or "0".

SUMMARY OF THE INVENTION

Accordingly, it is an object of the present invention to provide a reliable semiconductor memory device which can correctly determine the voltage levels of read data, without being subjected to the influence of supply voltage fluctuations.

According to the present invention, there is provided a semiconductor memory cell, comprising: (a) a memory cell array in which a plurality of memory cells are arranged in a matrix form; (b) a redundancy cell column including a plurality of redundancy cells arranged independently from the memory cells, the redundancy cell column being selected instead of a cell memory including a defective cell when a memory cell column including a defective cell is selected from the memory cell array; (c) a reference cell; (d) a plurality of dummy capacity cells connected in parallel to the reference cell; (e) at least one bit line to which an end of each of the memory cells belonging to the same column is connected; (f) a redundancy bit line to which an end of each of the redundancy cells belonging to the same redundancy cell column is connected; (g) a reference bit line to which one end of the reference cell and one end of each of the plural dummy capacity cells are connected; (h) a differential sense amplifier having a comparison side to which the bit line and the redundancy bit line are connected and a reference side to which the reference bit line is connected, respectively, for comparing a potential of a selected memory cell on the bit line with a potential of the reference cell on the reference bit line when the selected memory cell column includes no defective cell, but for comparing a potential of the selected redundancy cell on the redundancy bit line with a potential of the reference cell on the reference bit line when the selected memory cell column includes a defective cell, to determine whether the potential level of a data read out of any one of the memory cells and the redundancy cells is at "1" or "0"; and (i) at least one dummy capacity cell connected to the redundancy bit line, for equalizing a capacity on the reference bit line with a capacity on the redundancy bit line.

In the semiconductor memory device according to the present invention, since dummy capacity cells are provided for the redundancy bit line so that the capacity produced on the reference bit line is equal to that produced on the redundancy bit line, it is possible to prevent a data level from being determined erroneously even if the supply voltage fluctuates, thus realizing a high reliable semiconductor memory device.

DETAILED DESCRIPTION OF THE PREFERRED EMBODIMENTS

Figure 1:
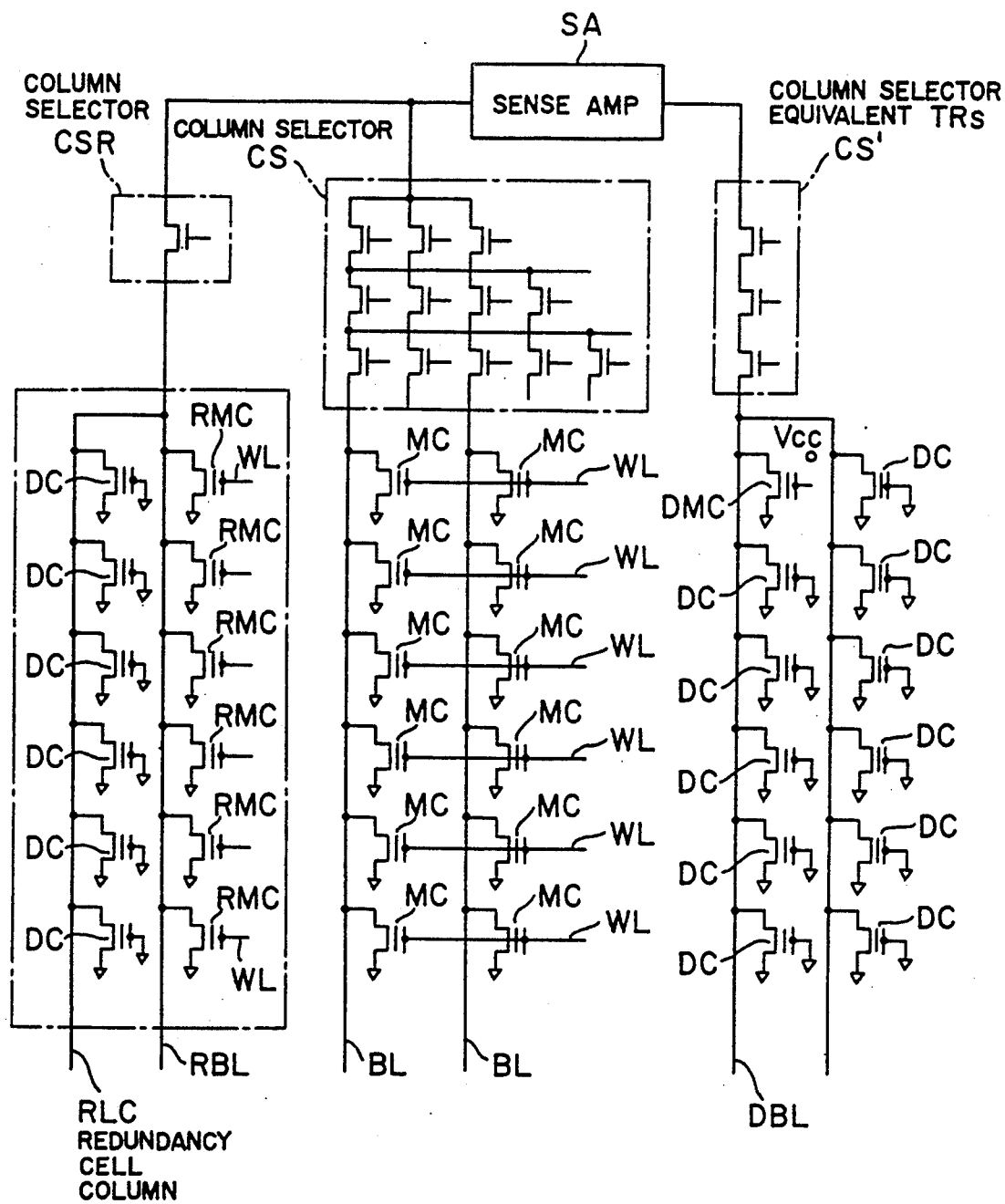
FIG. 1 is a circuit diagram showing an embodiment of the semiconductor memory device according to the present invention.
Figure 2:
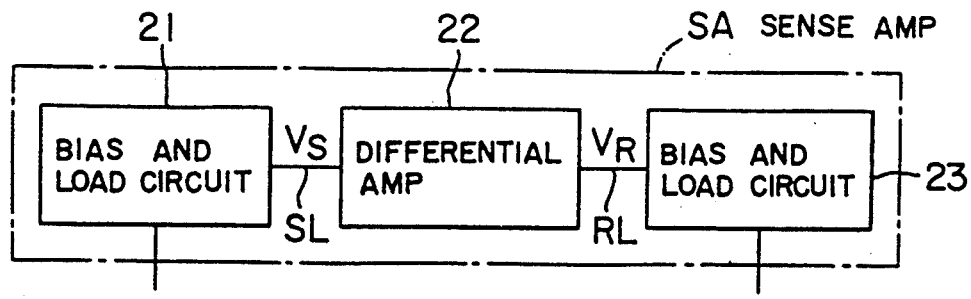
FIG. 2 is a block diagram showing a sense amplifier incorporated in the device shown in FIG. 1.

FIG. 1 shows an embodiment of the semiconductor memory device according to the present invention. The semiconductor memory device is a master-slice type EPROM obtained by connecting standard cells by a mask pattern wiring method as is well known. This EPROM comprises memory cells MC arranged in m (rows) x n (columns) matrix form, in which each gate of each memory cell arranged along the same row is connected to the same word line WL and each drain of each memory cell arranged along the same column is connected to the same bit line, respectively. A single word line WL is selected from m word lines by a row decoder (not shown) and a single bit line BL is selected from n bit lines by a column selector CS. Therefore, a single memory cell can be selected according to the selected word line (connected to the gate thereof) and the selected bit line (connected to the drain thereof). The selected memory cell MC is connected to a bias and load circuit 21 of a sense amplifier SA as shown in FIG. 2 via a column selector CS. Furthermore, the sense amplifier SA includes a differential amplifier 22, a pair of sense lines SL and RL, and another bias and load circuit 23, in addition to the bias and load circuit 21. The bit line potential varying according to data stored in the selected memory cell MC is amplified by the bias and load circuit 21, and then applied to one input (comparison input) terminal of the differential amplifier 22 via the sense line SL. On the other hand, a reference potential $V_R$ is applied to the other input (reference input) terminal of the differential amplifier 22 from a reference cell side circuit. This reference cell side circuit is arranged roughly symmetrically with respect to the circuit arranged from the memory cells MC for storing data to the comparison input terminal of the differential amplifier 22. The reference cell side circuit is composed of a reference cell DMC, a plurality of cells DC each of which functions as a dummy capacity cell, a reference bit line DBL, a column selector equivalent transistor CS', bias and load circuit 23, and a reference potential line (dummy sense line) RL. Furthermore, the dummy cell side circuit generates a reference potential $V_R$ set to a constant middle potential level between two potentials which change on the sense line SL according to data "1" or "0" stored in the memory cells MC. Therefore, the differential amplifier 22 can determine whether the data is at "1" or "0" by detecting whether the potential $V_S$ on the sense line SL is higher or lower than the reference potential $V_R$ on the reference sense line RL.

In this embodiment, a redundancy cell column RLC and a redundancy column selector CSR are arranged on the comparison input side of the sense amplifier SA. A plurality of redundancy cell column RLC are arranged in general, and each redundancy cell column RLC includes m-number of redundancy cells RMC. Each drain of each of these m-piece redundancy cells RMC is connected to a redundancy bit line RBL corresponding to each redundancy cell column. Furthermore, a plurality of dummy capacity cells DC are connected to the redundancy bit line RBL so that the capacity on the redundancy bit line RBL is roughly equal to that on the reference bit line DBL. The capacity on the reference bit line DBL is adjustable by changing the number of the dummy capacity cells DC connected to the reference bit line DBL, that is, by adjustably changing an aluminum wiring length with a mask pattern. Each gate of each redundancy cell RMC in each redundancy cell column RLC is connected to a common word line WL of each gate of each memory cell MC corresponding to the redundancy cell RMC arranged on a memory cell column corresponding to the redundancy cell column RLC of the memory cells arranged in m (rows) x n (columns) matrix form. The redundancy column selector CSR selects a redundancy cell column RLC.

The method of selecting the redundancy cell column RLC or the memory cell column when a column address is applied to the memory device will be described with reference to FIG. 3. An inputted column address is applied to a column selector CS and a redundancy cell selector 32 via a column address buffer 31. When the applied column address indicates an address designating a memory cell column including no defective cells, the memory cell column can be selected by the column selector CS, and the redundancy cell selector 32 will not function in this case. On the other hand, when the applied column address indicates an address designating a memory cell column including a defective cell, the redundancy cell selector 32 operates to generate a stop command signal for stopping the operation of the column selector CS to the column selector CS, and further sends a select signal for selecting a redundancy cell column to be selected in place of the memory cell column including a defective cell to the column selector CSR. Therefore, the column selector CSR selects a redundancy cell column without selecting the memory cell column including a defective cell.

The operation of the semiconductor memory device according to the present invention will be explained hereinbelow.

Figure 4A:
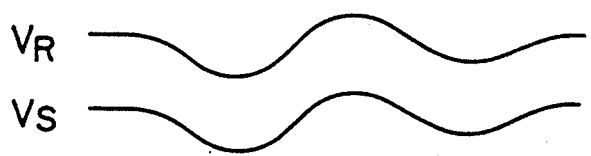
FIGS. 4A to 4C are waveform diagrams for describing fluctuations in the sense line and the reference potential line due to supply voltage fluctuations.

Here, where the potential $V_S$ on the sense line SL and the potential $V_R$ on the reference potential line RL both applied to the input terminals of the differential amplifier 22 to determine whether the data is at "1" or "0" both fluctuate in synchronism with each other, for instance as shown in FIGS. 4(A) and (B), since both the potentials $V_S$ and $V_R$ will not interfere with other, the level "1" or "0" will not be determined erroneously. However, where both the potentials $V_S$ and $V_R$ fluctuate in asymmetrical relationship with respect to each other due to difference in period between the two, since the two potentials $V_S$ and $V_R$ interfere with each other, as shown in FIG. 4(C), during the time period T, the level "1" or "0" of data is determined erroneously, so that an erroneously inverted data is outputted. To prevent the above-mentioned erroneous data level determination, the device of the present invention is configured in such a way that both the potentials $V_S$ and $V_R$ fluctuate symmetrically at the same frequency. That is, the capacity (including all parasitic capacities) produced on the bit lines BL is equalized to the capacity on the reference bit line DBL, and further the capacity on the comparison input terminal side (the sense line SL side) is also equalized with the capacity on the reference input side (the reference potential line RL side).

Figure 4B:
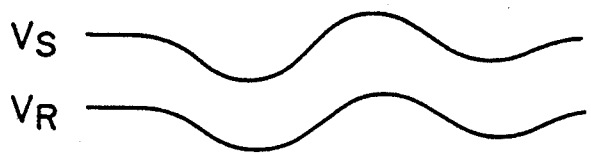
Figure 4C:
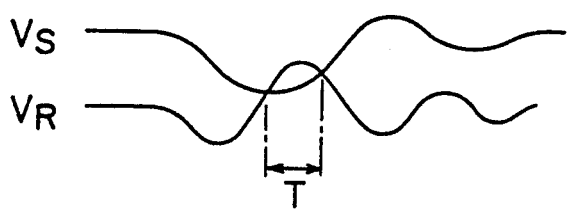

As described above, in the present invention, since the capacity on the redundancy bit line is determined equal to that on the reference bit line by connecting dummy capacity cells to both the lines, it is possible to synchronize the fluctuation frequency of the potential $V_S$ on the sense line SL with that of the potential $V_R$ on the reference line RL when a redundancy cell is selected, as shown in FIGS. 4(A) and 4(B). Therefore, the potential level "1" or "0" of the read data will not be determined erroneously.

Figure 3:
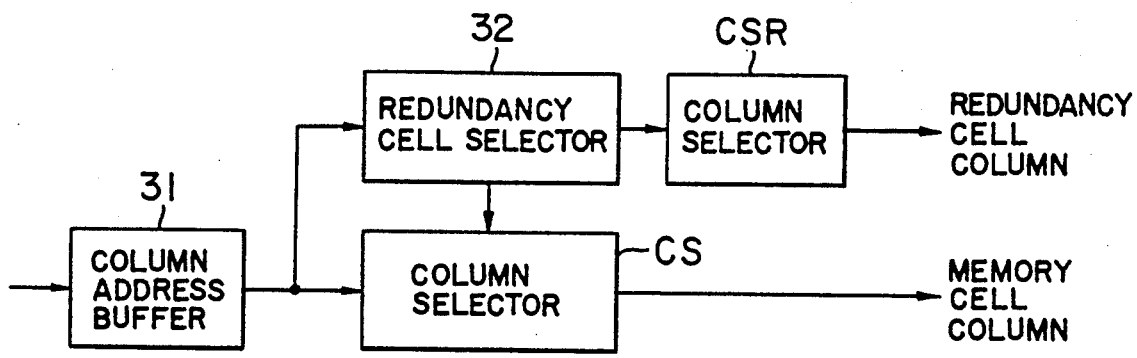
FIG. 3 is a block diagram for describing the selection operation of the redundancy cell column and the memory cell column.

Furthermore, when a redundancy cell RMC in the redundancy cell column RLC is selected, since the selection signal is applied via the redundancy cell selector 32 and the column selector CSR as shown in FIG. 3, an access time to the cell is relatively long as compared with when the memory cell MC in the memory cell column is selected. Therefore, in general, it is required to realize the harmony between the capacity equalization and the access time. With respect to this point in the present invention, however, since the dummy capacity can be adjusted finely on the order of a unit cell by changing the aluminum bit line length passing on the dummy capacity cells DC, it is possible to optimize the mutual relationship between the capacity equalization and the access time.

As explained above, according to the present invention, since the dummy capacity cells DC are connected to the redundancy bit line RBL in such a way that the capacity on the redundancy bit line RBL (to which drains of the redundancy cells RMC in the redundancy cell column RLC are connected) is roughly equal to that on the reference bit line DBL, in case the supply voltage Vcc fluctuates, it is possible to prevent the potential level of read data from being erroneously determined, and therefore realize a highly reliable semiconductor memory device.

What is claimed is:

1. A semiconductor memory cell, comprising:
   (a) a memory cell array in which a plurality of memory cells are arranged in a matrix form;
   (b) a redundancy cell column including a plurality of redundancy cells arranged independently from said memory cells, said redundancy cell column being selected instead of a cell memory including a defective cell when a memory cell column including a defective cell is selected from said memory cell array;
   (c) a reference cell;
   (d) a plurality of dummy capacity cells connected in parallel to said reference cell;
   (e) at least one bit line to which an end of each of said memory cells belonging to the same column is connected;
   (f) a redundancy bit line to which an end of each of said redundancy cells belonging to the same redundancy cell column is connected;
   (g) a reference bit line to which one end of said reference cell and one end of each of said plural dummy capacity cells are connected;
   (h) a differential sense amplifier having a comparison side to which said bit line and said redundancy bit line are connected and a reference side to which said reference bit line is connected, respectively, for comparing a potential of a selected memory cell on said bit line with a potential of said reference cell on said reference bit line when the selected memory cell column includes no defective cell, but for comparing a potential of the selected redundancy cell on said redundancy bit line with a potential of the reference cell on said reference bit line when the selected memory cell column includes a defective cell, to determine whether the potential level of a data read out of any one of the memory cells and the redundancy cells is at "1" or "0"; and
   (i) at least one dummy capacity cell connected to said redundancy bit line, for equalizing a capacity on said reference bit line with a capacity on said redundancy bit line.

2. The semiconductor memory cell according to claim 1, wherein said memory device is an EPROM formed with standard cells and wired by master slice method, and the number of said dummy capacity cells connected to said redundancy bit line is determined by use of a metal wiring pattern.

* * * * *